United States Patent
Kato et al.

(10) Patent No.: US 6,899,991 B2
(45) Date of Patent: May 31, 2005

(54) PHOTO-CURABLE RESIN COMPOSITION, PATTERNING PROCESS, AND SUBSTRATE PROTECTING FILM

(75) Inventors: Hideto Kato, Gunma-ken (JP); Kazumi Noda, Gunma-ken (JP); Toshihiko Fujii, Gunma-ken (JP); Kazuhiro Arai, Gunma-ken (JP); Satoshi Asai, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/266,566

(22) Filed: Oct. 9, 2002

(65) Prior Publication Data

US 2003/0113662 A1 Jun. 19, 2003

(30) Foreign Application Priority Data

Oct. 9, 2001 (JP) ........................................ 2001-311374

(51) Int. Cl.[7] .............................................. G03F 7/004
(52) U.S. Cl. ..................... 430/270.1; 430/325; 430/927; 427/510; 522/99; 522/148
(58) Field of Search .............................. 430/270.1, 325, 430/927; 522/99, 148; 427/510

(56) References Cited

U.S. PATENT DOCUMENTS

| | | | | |
|---|---|---|---|---|
| 6,096,479 A | * | 8/2000 | Kawamura et al. | 430/270.1 |
| 6,436,593 B1 | * | 8/2002 | Minegishi et al. | 430/18 |
| 6,534,235 B1 | * | 3/2003 | Hanabata et al. | 430/191 |

FOREIGN PATENT DOCUMENTS

| EP | 1186624 | * | 3/2002 | ........... G03F/7/075 |
|---|---|---|---|---|
| JP | 11-335464 A | | 12/1999 | |

OTHER PUBLICATIONS

English language machine translation of JP 11–335464.*

* cited by examiner

Primary Examiner—Amanda Walke
(74) Attorney, Agent, or Firm—Birch, Stewart, Kolasch & Birch, LLP

(57) ABSTRACT

A photo-curable resin composition comprising (A) an organosiloxane-bearing polymer comprising recurring units of formula (1):

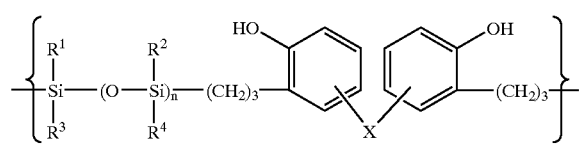

wherein $R^1$ to $R^4$ are monovalent $C_1$–$C_8$ hydrocarbon, n is an integer of 1–1,000, and X is

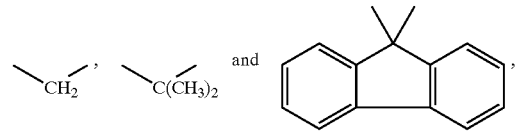

and having a Mw of 500–200,000, (B) a formalin-modified or formalin-alcohol-modified amino condensate, a phenol compound having on the average at least two methylol or alkoxymethylol radicals, or an epoxy compound having on the average at least two epoxy radicals, (C) a photoacid generator, and (D) a silicon compound of the formula: $(R^{11})_m Si(OR^{12})_{4-m}$ wherein $R^{11}$ is monovalent $C_1$–$C_9$ hydrocarbon, $R^{12}$ is $C_1$–$C_4$ alkyl, m is 0–2, forms cured pattern films having dry etch resistance and improved adhesion to substrates.

6 Claims, No Drawings

PHOTO-CURABLE RESIN COMPOSITION, PATTERNING PROCESS, AND SUBSTRATE PROTECTING FILM

This nonprovisional application claims priority under 35 U.S.C. § 119(a) on Patent Application No. 2001-311374 filed in JAPAN on Oct. 9, 2001, which is herein incorporated by reference.

This invention relates to a photo-curable resin composition comprising a specific organosiloxane-bearing polymer and having improved adhesion to substrates, a pattering process, and a substrate protecting film using the same.

BACKGROUND OF THE INVENTION

Known photosensitive insulating materials used in the fabrication of semiconductor integrated circuits include positive resist materials containing novolac resins and 1,2-quinonediazide compounds, and photosensitive polyimide base materials in the cured state. These materials, however, are not regarded as fully satisfactory in dry etch resistance, adhesion to substrates and some other properties.

SUMMARY OF THE INVENTION

An object of the invention is to provide a photo-curable resin composition capable of forming a patterned film having improved adhesion to substrates and dry etch resistance.

It has been found that a photo-curable resin composition comprising an organosiloxane-bearing polymer based on recurring units of formula (1) and having a weight average molecular weight of 500–200,000 is fully compatible with a silicon compound of formula (2) or a hydrolytic condensate thereof, and that the resulting composition can form a cured film having improved adhesion to substrates.

In a first aspect, the present invention provides a photo-curable resin composition comprising (A) an organosiloxane-bearing polymer comprising recurring units of the following general formula (1):

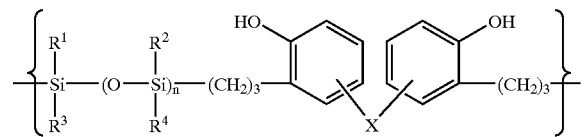

(1)

wherein $R^1$ to $R^4$ are each independently a monovalent hydrocarbon radical of 1 to 8 carbon atoms, n is an integer of 1 to 1,000, and X is a radical selected from among

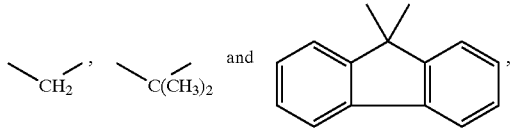

and having a weight average molecular weight of 500 to 200,000, (B) at least one member selected from the group consisting of formalin-modified or formalin-alcohol-modified amino condensates, phenol compounds having on the average at least two methylol or alkoxymethylol radicals per molecule, and epoxy compounds having on the average at least two epoxy radicals per molecule, (C) a photoacid generator, and (D) a silicon compound of the following general formula (2):

$$(R^{11})_m Si(OR^{12})_{4-m} \quad (2)$$

wherein $R^{11}$ is a substituted or unsubstituted monovalent hydrocarbon radical of 1 to 9 carbon atoms, $R^{12}$ is an alkyl radical of 1 to 4 carbon atoms, $R^{11}$ and $R^{12}$ may be the same or different, m is an integer of 0 to 2, or a partial hydrolytic condensate thereof.

In a second aspect, the invention provides a pattern forming process comprising the steps of (i) applying the photo-curable resin composition to a substrate to form a coating, (ii) exposing the coating to light having a wavelength of 150 to 450 nm through a photomask, and (iii) developing the exposed coating with a developer.

Also contemplated herein is a substrate protecting film obtained by post curing a patterned film of the photo-curable resin composition.

DESCRIPTION OF THE PREFERRED EMBODIMENTS

Component (A) in the photo-curable resin composition of the present invention is an organosiloxane-bearing polymer comprising recurring units of the following general formula (1) and having a weight average molecular weight of 500 to 200,000.

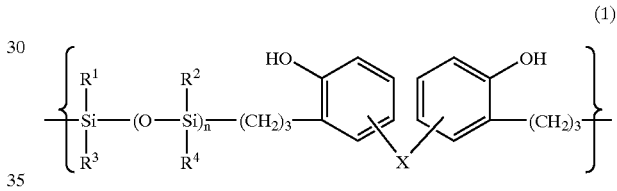

(1)

Herein $R^1$ to $R^4$ are each independently a monovalent hydrocarbon radical of 1 to 8 carbon atoms, preferably 1 to 6 carbon atoms. Examples include straight, branched or cyclic alkyl radicals such as methyl, ethyl, propyl, isopropyl, n-butyl, tert-butyl and cyclohexyl, straight, branched or cyclic alkenyl radicals such as vinyl, allyl, propenyl, butenyl, hexenyl and cyclohexenyl, aryl radicals such as phenyl and tolyl, and aralkyl radicals such as benzyl and phenylethyl.

The subscript n is an integer of 1 to 1,000, preferably 1 to 100. With n>1,000, the polymer becomes less compatible with component (B) as typified by formalin- or formalin-alcohol-modified amino condensates and photoacid generator (C), losing a photo-cure ability.

X is a radical selected from the following.

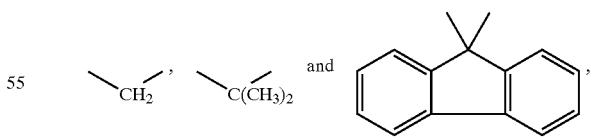

The organosiloxane-bearing polymer should have a weight average molecular weight (Mw) of 500 to 200,000, preferably 1,000 to 100,000. With Mw<500, a satisfactory photo-cure ability is lost. With Mw>200,000, the polymer becomes less compatible with component (B) as typified by formalin- or formalin-alcohol-modified amino condensates and photoacid generator (C).

Component (B) is selected from among formalin-modified or formalin-alcohol-modified amino condensates, phenol compounds having on the average at least two methylol or alkoxymethylol radicals per molecule, and epoxy compounds having on the average at least two epoxy radicals per molecule, and mixtures thereof.

Component (B) incurs curing reaction with component (A) to further enhance the strength of cured composition. The resin used as component (B) for such a purpose preferably has a weight average molecular weight (Mw) of 200 to 5,000, preferably 300 to 3,000. With Mw<200, a satisfactory photo-cure ability may be lost. With Mw>5,000, the resin may become less compatible with the organosiloxane-bearing polymer (A).

Among component (B), the formalin-modified or formalin-alcohol-modified amino condensates include, for example, melamine condensates modified with formalin or formalin-alcohol, and urea condensates modified with formalin or formalin-alcohol.

With respect to the preparation of the melamine condensates, in a first stage, a melamine monomer is modified with formalin into a methylol form according to a well-known method, and optionally, further modified with an alcohol into an alkoxy form, obtaining a modified melamine having formula (3). The alcohols used herein are lower alcohols, preferably alcohols of 1 to 4 carbon atoms.

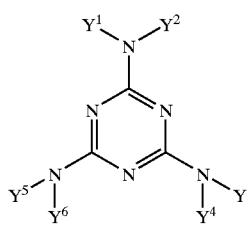
(3)

Herein, $Y^1$ to $Y^6$ which may be the same or different are methylol radicals, alkoxymethyl radicals containing a $C_1$–$C_4$ alkoxy radical, or hydrogen, and at least one of $Y^1$ to $Y^6$ is a methylol or alkoxymethyl radical. Illustrative of the radicals represented by $Y^1$ to $Y^6$ are methylol, alkoxymethyl radicals such as methoxymethyl and ethoxymethyl, and hydrogen.

Illustrative examples of the modified melamine having formula (3) include trimethoxymethylmonomethylolmelamine, dimethoxymethylmonomethylolmelamine, trimethylolmelamine, hexamethylolmelamine, and hexamethoxymethylolmelamine.

Next, the modified melamine having formula (3) or an oligomer thereof (e.g., dimer, trimer, etc.) is subjected to addition condensation polymerization with formaldehyde in a conventional manner, until a desired molecular weight is reached. This yields a formalin-modified or formalin-alcohol-modified melamine condensate suitable as component (B). One or more modified melamine condensates may be used as component (B).

With respect to the preparation of the formalin-modified or formalin-alcohol-modified urea condensates, a urea condensate having a predetermined molecular weight is modified with formalin into a methylol form according to a well-known method and optionally, further modified with an alcohol into an alkoxy form.

Illustrative examples of the modified urea condensates include methoxymethylated urea condensates, ethoxymethylated urea condensates, and propoxymethylated urea condensates. One or more modified urea condensates may be used as component (B).

Among component (B), the phenol compounds having on the average at least two methylol or alkoxymethylol radicals per molecule include, for example, (2-hydroxy-5-methyl)-1,3-benzene dimethanol and 2,2', 6,6'-tetramethoxymethylbisphenol A.

Among component (B), the epoxy compounds having on the average at least two epoxy radicals per molecule include, for example, bisphenol type epoxy resins such as bisphenol A epoxy resins and bisphenol F epoxy resins, novolac type epoxy resins such as phenol novolac epoxy resins and cresol novolac epoxy resins, triphenolalkane type epoxy resins and polymers thereof, biphenyl type epoxy resins, dicyclopentadiene-modified phenol novolac type epoxy resins, phenol aralkyl type epoxy resins, biphenyl aralkyl type epoxy resins, naphthalene ring-bearing epoxy resins, glycidyl ester type epoxy resins, alicyclic epoxy resins, and heterocyclic epoxy resins.

These amino condensates, phenol compounds and epoxy compounds may be used alone or in admixture of any as component (B).

An amount of the amino condensates, phenol compounds or epoxy compounds blended as component (B) is preferably 1 to 50 parts, more preferably 1 to 30 parts by weight per 100 parts by weight of the organosiloxane-bearing polymer. Less than 1 part of component (B) may fail to provide sufficient cure upon light exposure. More than 50 parts of component (B) may give a photo-curable resin composition in which the proportion of siloxane bonds is too low for the cured composition to exert the desired effects.

Component (C) is a photoacid generator, that is, a compound capable of generating an acid upon exposure to light, the acid serving as a curing catalyst. Suitable photoacid generators include onium salts, diazomethane derivatives, glyoxime derivatives, β-ketosulfone derivatives, disulfone derivatives, nitrobenzylsulfonate derivatives, sulfonic acid ester derivatives, imidoyl sulfonate derivatives, oxime sulfonate derivatives, and triazine derivatives.

The onium salts used as the photoacid generator include compounds of the general formula (4).

(4)

In the formula, $R^5$ is a straight, branched or cyclic alkyl of 1 to 12 carbon atoms, an aryl of 6 to 12 carbon atoms, or an aralkyl of 7 to 12 carbon atoms, which may have substituents; $M^+$ is iodonium or sulfonium; $K^-$ is a non-nucleophilic counter-ion; and "a" is 2 or 3.

Illustrative examples of alkyl radicals represented by $R^5$ include methyl, ethyl, propyl, butyl, cyclohexyl, 2-oxocyclohexyl, norbornyl, and adamantyl. Exemplary aryl radicals include phenyl; alkoxyphenyl radicals such as o-, m- or p-methoxyphenyl, ethoxyphenyl, and m- or p-tert-butoxyphenyl; and alkylphenyl radicals such as 2-, 3- or 4-methylphenyl, ethylphenyl, 4-tert-butylphenyl, 4-butylphenyl, and dimethylphenyl. Exemplary aralkyl radicals include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluoro-butanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

The diazomethane derivatives used as the photoacid generator include compounds of the general formula (5).

(5)

In the formula, $R^6$ and $R^7$ are each independently straight, branched or cyclic alkyl or halogenated alkyl radicals of 1 to 12 carbon atoms, aryl or halogenated aryl radicals of 6 to 12 carbon atoms, or aralkyl radicals of 7 to 12 carbon atoms.

Illustrative examples of alkyl radicals represented by $R^6$ and $R^7$ include methyl, ethyl, propyl, butyl, amyl, cyclopentyl, cyclohexyl, norbornyl, and adamantyl. Exemplary halogenated alkyl radicals include trifluoromethyl, 1,1,1-trifluoroethyl, 1,1,1-trichloroethyl, and nonafluorobutyl. Exemplary aryl radicals include phenyl; alkoxyphenyl radicals such as o-, m- or p-methoxyphenyl, ethoxyphenyl, and m- or p-tert-butoxyphenyl; and alkylphenyl radicals such as 2-, 3- or 4-methylphenyl, ethylphenyl, 4-tert-butylphenyl, 4-butylphenyl, and dimethylphenyl. Exemplary halogenated aryl radicals include fluorophenyl, chlorophenyl, and 1,2,3,4,5-pentafluorophenyl. Exemplary aralkyl radicals include benzyl and phenethyl.

The glyoxime derivatives used as the photoacid generator include compounds of the general formula (6).

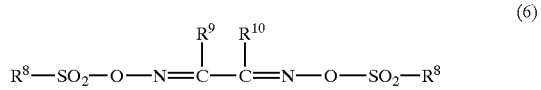

(6)

In the formula, $R^8$ to $R^{10}$ are each independently straight, branched or cyclic alkyl or halogenated alkyl radicals of 1 to 12 carbon atoms, aryl or halogenated aryl radicals of 6 to 12 carbon atoms, or aralkyl radicals of 7 to 12 carbon atoms. $R^9$ and $R^{10}$ may together form a cyclic structure, and $R^9$ and $R^{10}$ are each independently a straight or branched alkylene radical of 1 to 6 carbon atoms if they form a cyclic structure.

The alkyl, halogenated alkyl, aryl, halogenated aryl, and aralkyl radicals represented by $R^8$ to $R^{10}$ are exemplified by the same radicals as mentioned above for $R^6$ and $R^7$. Examples of alkylene radicals represented by $R^9$ and $R^{10}$ include methylene, ethylene, propylene, butylene, and hexylene.

Illustrative examples of operable photoacid generators are given below. Suitable onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, and diphenyl(4-thiophenoxyphenyl)sulfonium hexafluoroantimonate.

Suitable diazomethane derivatives include bis(benzenesulfonyl)diazomethane, bis(p-toluenesulfonyl)diazomethane, bis(xylenesulfonyl)diazomethane, bis(cyclohexylsulfonyl)-diazomethane, bis(cyclopentylsulfonyl)diazomethane, bis(n-butylsulfonyl)diazomethane, bis(isobutylsulfonyl)-diazomethane, bis(sec-butylsulfonyl)diazomethane, bis(n-propylsulfonyl)diazomethane, bis(isopropylsulfonyl)-diazomethane, bis(tert-butylsulfonyl)diazomethane, bis(n-amylsulfonyl)diazomethane, bis(isoamylsulfonyl)diazo-methane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane.

Suitable glyoxime derivatives include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime.

Other useful photoacid generators include oxime sulfonate derivatives such as α-(benzenesulfonium oxyimino)-4-methylphenylacetonitrile; β-ketosulfone derivatives such as 2-cyclohexylcarbonyl-2-(p-toluenesulfonyl)propane and 2-isopropylcarbonyl-2-(p-toluenesulfonyl)propane; disulfone derivatives such as diphenyl disulfone and dicyclohexyl disulfone; nitrobenzyl sulfonate derivatives such as 2,6-dinitrobenzyl p-toluenesulfonate and 2,4-dinitrobenzyl p-toluenesulfonate; sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxy-imidoyl n-butylsulfonate, and N-trifluoromethylsulfonyloxy-naphthylimide.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazo-methane, bis(p-toluenesulfonyl)diazomethane, bis(cyclohexyl-sulfonyl)diazomethane, bis(n-butylsulfonyl)diazomethane, bis(isobutylsulfonyl)diazomethane, bis(sec-butylsulfonyl)-diazomethane, bis(n-propylsulfonyl)diazomethane, bis(isopropylsulfonyl)diazomethane, and bis(tert-butylsulfonyl)diazomethane; and glyoxime derivatives such as bis-O-(p-toluenesulfonyl)-α-dimethylglyoxime and bis-O-(n-butanesulfonyl)-α-dimethylglyoxime. These photoacid generators may be used singly or in combinations of two or more.

The photoacid generator (C) is preferably added in an amount of about 0.1 to 20 parts by weight, more preferably 0.5 to 5 parts by weight by weight per 100 parts by weight of the organosiloxane-bearing polymer (A). Less than 0.1 part of the photoacid generator may fail to achieve a sufficient photo-cure ability, whereas more than 20 parts may adversely affect the photo-cure of a thick film because of light absorption of the photoacid generator itself.

Component (D) is a silicon compound of the following general formula (2) or a partial hydrolytic condensate thereof.

$$(R^{11})_m Si(OR^{12})_{4-m} \qquad (2)$$

Herein $R^{11}$ is a substituted or unsubstituted monovalent hydrocarbon radical of 1 to 9 carbon atoms, $R^{12}$ is an alkyl radical of 1 to 4 carbon atoms, $R^{11}$ and $R^{12}$ may be the same or different, m is an integer of 0 to 2.

Examples of operable silicon compounds include trimethoxysilane, triethoxysilane, tripropoxysilane, tetramethoxysilane, tetraethoxysilane, tetrapropoxysilane, methyltrimethoxysilane, ethyltrimethoxysilane, propyltrimethoxysilane, methyltriethoxysilane, ethyltriethoxysilane, propyltriethoxysilane, dimethyldimethoxysilane, diethyldiethoxysilane, vinyltrimethoxysilane, vinyltriethoxysilane, γ-(methacryloxypropyl)trimethoxysilane, γ-(methacryloxypropyl)methyldimethoxysilane, γ-glycidoxy-propyltrimethoxysilane, γ-glycidoxypropyltriethoxysilane, γ-glycidoxypropylmethyldiethoxysilane, N-β-(aminoethyl)-γ-aminopropyltrimethoxysilane, N-β-(aminoethyl)-γ-aminopropyltriethoxysilane, N-β-(aminoethyl)-γ-aminopropylmethyldimethoxysilane, γ-aminopropyltrimethoxysilane, γ-aminopropyltriethoxysilane, N-phenyl-γ-aminopropyltrimethoxysilane, γ-mercaptopropyltrimethoxysilane, γ-chloropropyltrimethoxysilane, and partial hydrolytic condensates thereof. Of these, preferred are tetramethoxysilane, tetraethoxysilane, methyltrimethoxysilane, methyltriethoxysilane, ethyltrimethoxysilane, ethyltriethoxysilane, N-β-(aminoethyl)-γ-aminopropylmethyldimethoxysilane, N-β-(aminoethyl)-γ-aminopropyltrimethoxysilane, γ-glycidoxypropyltrimethoxysilane, γ-aminopropyltriethoxysilane, γ-(methacryloxypropyl)-trimethoxysilane, and partial hydrolytic condensates thereof.

The silicon compounds and partial hydrolytic condensates thereof may be used alone or in admixture of any. The partial hydrolytic condensate may be a co-hydrolyzate of two or more alkoxysilanes.

An appropriate amount of the silicon compound or partial hydrolytic condensate (D) blended is 0.01 to 20 parts by weight, more preferably 0.05 to 5 parts by weight per 100 parts by weight of the organosiloxane-bearing polymer (A). Less than 0.01 part of component (D) may fail to fully improve the adhesion between a coating of the composition and a substrate whereas a composition containing more than 20 parts of component (D) may form a less curable coating.

If necessary, an organic solvent may be blended in the photo-curable resin composition of the invention. Those organic solvents in which components (A) to (D) are dissolvable are preferred. Illustrative, non-limiting, examples of the organic solvent include ketones such as cyclohexanone, cyclopentanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. The solvents may be used alone or in admixture of any.

In addition to the above-described components, the photo-curable resin composition of the invention may further include optional ingredients, typically surfactants for improving coating characteristics and light absorbers for improving light absorption efficiency. Optional ingredients may be added in conventional amounts so long as this does not compromise the objects of the invention.

Nonionic surfactants are preferred and include fluorochemical surfactants, for example, perfluoroalkyl polyoxyethylene ethanols, fluorinated alkyl esters, perfluoroalkylamine oxides, and fluorinated organosiloxane compounds. They are commercially available. Illustrative examples include Florade FC-430 and FC-431 from Sumitomo 3M Ltd., Surflon S-141 and S-145 from Asahi Glass Co., Ltd., Unidyne DS-401, DS-4031, and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants are Florade FC-430 from Sumitomo 3M Ltd. and X-70-093 from Shin-Etsu Chemical Co., Ltd.

Suitable light absorbers include, for example, diaryl sulfoxide, diaryl sulfone, 9,10-dimethylanthracene and 9-fluorenone. Besides, when the photo-curable resin composition of the invention is used as a resist material, any of additives commonly employed in resist materials may be used.

Any desired method may be used in preparing the photo-curable resin composition of the invention. It is generally prepared by agitating and mixing the above-described components and optionally, the organic solvent and additives, and passing the mixture through a filter to remove solids.

The photo-curable resin composition of the invention thus prepared is advantageously used as protective coatings, insulating coatings, release coatings, and even such materials as micro-patterning photoresists.

Using the photo-curable resin composition of the invention, a pattern can be formed. The patterning process involves the steps of (i) applying the photo-curable resin composition to a substrate to form a coating, (ii) exposing the coating to light having a wavelength of 150 to 450 nm through a photomask, and (iii) developing the exposed coating with a developer.

More particularly, the first step of the patterning process is to apply the photo-curable resin composition to a substrate to form a coating thereon. Typical substrates are silicon wafers and quartz substrates. The coating technique may be any of well-known techniques employed in the lithography technology. The composition can be applied by any conventional coating technique, for example, dipping, spin coating, and roll coating. The build-up of the composition may be suitably chosen for a particular purpose and usually to a thickness of 0.1 to 100 μm.

In order that effective photo-curing reaction take place, the coating may be preheated for causing the solvent to volatilize off. Better results are obtained by preheating at 40 to 140° C. for about 1 to 10 minutes, for example.

The coating is then exposed to light having a wavelength of 150 to 450 nm through a photomask whereupon the coating cures. The photomask may be one having a desired pattern cut therein. The photomask is preferably made of a material that shields light having a wavelength of 150 to 450 nm, for example, chromium.

Examples of the light having a wavelength of 150 to 450 nm include radiation having different wavelength emitted by a radiation generator, for example, UV light, typically g and i-lines, deep UV light (248 nm, 198 nm), and electron beams. The preferred exposure is, for example, 10 to 500 mJ/cm².

If desired for further enhancing development sensitivity, the coating may be heat treated at the end of curing. The heat treatment after the curing may be, for example, 40 to 140° C. and 0.5 to 10 minutes.

At the end of curing, the coating is developed with a developer. Suitable developers used herein are conventional organic solvents, typically isopropyl alcohol. Development can be carried out by a conventional technique, for example, by immersing the cured pattern coating in the developer. This is optionally followed by rinsing and drying. In this way, a cured film having the predetermined pattern is obtained.

The pattern forming process has been described. If it is unnecessary to form a pattern, that is, if it is desired to form a uniform thin film, the same process as the pattern forming process may be employed except that the photomask is omitted.

The photo-cured pattern obtained by the above process can be utilized as a mask in processing the underlying substrate. Since the pattern or film has siloxane bonds and high resistance to oxygen plasma, it is a very useful mask.

If desired, the pattern or film can be heated in an oven or on a hot plate at 150 to 250° C. for about 10 minutes to about 2 hours, for thereby increasing the crosslinking density and removing any residual volatiles. Then the film is further improved in adhesion to the substrate, heat resistance, strength and electrical properties.

The cured coating of the photo-curable resin composition has improved substrate adhesion, heat resistance, and electrical insulating properties and is advantageously used as a protective film on electric and electronic parts and semiconductor devices.

EXAMPLE

Synthesis Examples, Examples and Comparative Examples are given below for illustrating the present invention, but the invention is not limited thereto. All parts are by weight.

Synthesis Example 1

A flask equipped with a stirrer, thermometer, nitrogen inlet and reflux condenser was charged with 43.0 g of 4,4'-(9H-fluoren-9-ylidene)bis[(2-propenyl)phenol], 60 g of toluene and 0.1 g of chloroplatinic acid and heated at 80° C. Then, 13.4 g of 1,3-dihydro-1,1,3,3-tetramethyldisiloxane was added dropwise to the flask. At the end of dropwise addition, the contents were ripened at 100° C. for one hour, after which toluene was distilled off. This yielded 54 g of a solid product. The polymer thus obtained had recurring units shown below and a weight average molecular weight of 18,000 as measured by GPC using a polystyrene standard.

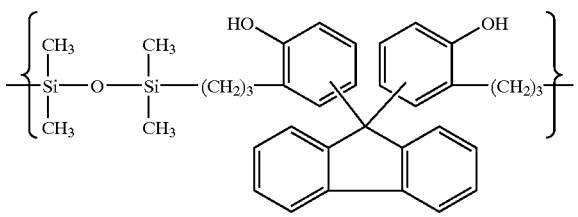

Synthesis Example 2

The procedure of Synthesis Example 1 was repeated except that 41.8 g of 4,4'-(9H-fluoren-9-ylidene)bis[(2-propenyl)phenol] was used, and 196.0 g of a dihydrosiloxane wherein 20% of $R^1$ to $R^4$ are phenyl, 80% of $R^1$ to $R^4$ are methyl, and n is 19 was used instead of the 1,3-dihydro-1,1,3,3-tetramethyldisiloxane. There was obtained 230 g of a liquid product. The polymer thus obtained had recurring units shown below and a weight average molecular weight of 40,000.

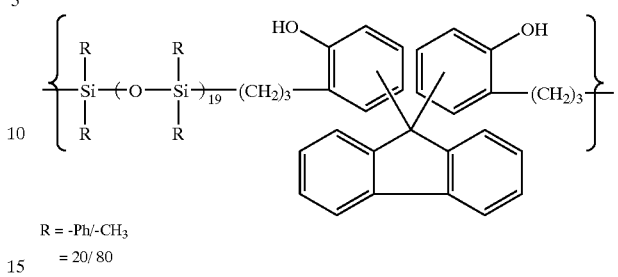

R = -Ph/-CH$_3$
= 20/80

Example 1

The organosiloxane-bearing polymer prepared in Synthesis Example 1, an amino condensate serving as a crosslinking agent, a photoacid generator, a silicon compound, an organic solvent, and a fluorochemical surfactant X-70-093 (Shin-Etsu Chemical Co., Ltd.) as shown in Table 1 were blended in accordance with the formulation shown in Table 1. They were agitated, mixed, then passed through a Teflon® filter for removing solids, yielding a photo-curable resin composition within the scope of the invention.

The photo-curable resin composition was applied to a silicon wafer by a spin coating technique, so as to give a dry coating thickness of 10 μm. The coating was heated at 80° C. for one minute for removing the solvent. The coated substrate was exposed to light having a wavelength in an exposure as shown in Table 1. At the end of irradiation, it was heated at 60° C. for one minute and cooled.

Next, the coated substrate was immersed in isopropyl alcohol for one minute for development. There was obtained a cured film having a good film retention as shown in Table 1.

Example 2

The organosiloxane-bearing polymer prepared in Synthesis Example 1, a tetramethoxymethylol bisphenol A serving as a crosslinking agent, a photoacid generator, a silicon compound, an organic solvent, and an additive as shown in Table 1 were blended in accordance with the formulation shown in Table 1. They were agitated, mixed, then passed through a Teflon® filter for removing solids, yielding a photo-curable resin composition within the scope of the invention.

Next, the coating, exposure and development steps were carried out as in Example 1 except that the coated substrate was not heated at the end of exposure. There was obtained a cured film having a good film retention as shown in Table 1.

Example 3

The organosiloxane-bearing polymer prepared in Synthesis Example 2, an amino condensate serving as a crosslinking agent, a photoacid generator, and a silicon compound as shown in Table 1 were blended in accordance with the formulation shown in Table 1. They were agitated, mixed, then passed through a Teflon® filter for removing solids, yielding a photo-curable resin composition within the scope of the invention.

Next, the coating, exposure and development steps were carried out as in Example 2. There was obtained a cured film having a good film retention as shown in Table 1.

Comparative Example 1

The organosiloxane-bearing polymer prepared in Synthesis Example 2, an epoxy compound serving as a crosslinking agent, and a photoacid generator as shown in Table 1 were blended in accordance with the formulation shown in Table 1. They were mixed as in Example 1, yielding a photo-curable resin composition outside the scope of the invention.

Next, the coating, exposure and development steps were carried out as in Example 2. The cured film was unsatisfactory due to partial separation.

The photoacid generators I and II shown in Table 1 have the following structure.

Films were similarly patterned and cured to silicon nitride film and copper plate and post-cured by heating in a dryer at 180° C. for one hour. The adhesion of the films to the substrate after post-curing was examined by a cross-hatch adhesive tape test. The results are shown in Table 1 under the heading of "Substrate adhesion after post-curing."

The cured films of Examples 1 to 3 showed firm adhesion to the substrates, indicating that the cured composition is useful as a protective film on electronic parts.

Using the photo-curable resin composition of the invention, cured films which can be patterned and have dry etch resistance and improved adhesion to substrates can be formed.

Japanese Patent Application No. 2001-311374 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

TABLE 1

(I) Structure: naphthalimide-N-O-sulfonyl-phenyl (II) Structure: $C_5H_{11}O$—phenyl—CH=CH—triazine with two $CCl_3$ groups

| Organosiloxane-bearing polymer | Crosslinking agent | Photoacid generator | Silicon compound | Additives | Light source/exposure | Film retention after exposure | Substrate adhesion after post-curing |
|---|---|---|---|---|---|---|---|
| Example 1 | | | | | | | |
| Synthesis Example 1, 100 pbw | hexamethoxy-methylolmelamine, 15 pbw | I, 1 pbw | γ-aminopropyltri-ethoxy-silane, 3 pbw | ethyl lactate 150 pbw X-70-093 0.001 pbw | 365 nm 190 mJ/cm$^2$ | 95% | no peel |
| Example 2 | | | | | | | |
| Synthesis Example 1, 100 pbw | tetramethoxy-methylol-bisphenol A, 20 pbw | II, 1 pbw | γ-(meth-acryloxy-propyl)-trimethoxy-silane, 3 pbw | cyclo-hexanone 150 pbw X-70-093 0.001 pbw | 436 nm 200 mJ/cm$^2$ | 97% | no peel |
| Example 3 | | | | | | | |
| Synthesis Example 2, 100 pbw | hexamethoxy-methylolmelamine, 15 pbw | I, 1 pbw | γ-aminopropyltri-ethoxy-silane, 3 pbw | — | 365 nm 200 mJ/cm$^2$ | 94% | no peel |
| Comparative Example 1 | | | | | | | |
| Synthesis Example 2, 100 pbw | N,N-diglycidyl-4-glycidyloxy-aniline, 10 pbw | I, 1 pbw | — | — | 365 nm 150 mJ/cm$^2$ | — (separated) | — (separated) |

What is claimed is:

1. A photo-curable resin composition comprising (A) 100 parts by weight of an organosiloxane-bearing polymer based on recurring units of the following general formula (1):

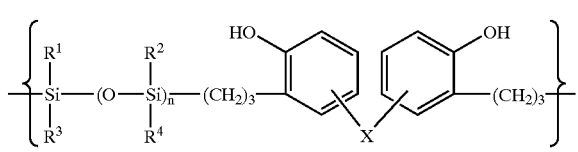

(1)

wherein $R^1$ to $R^4$ are each independently a monovalent hydrocarbon radical of 1 to 8 carbon atoms, n is an integer of 1 to 1,000, and X is a radical selected from the group consisting of

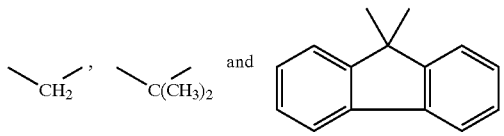

and having a weight average molecular weight of 500 to 200,000, (B) 1 to 50 parts by weight of at least one member selected from the group consisting of formalin-modified or formalin-alcohol-modified amino condensates, phenol compounds having on the average at least two methylol or alkoxymethylol radicals per molecule, and epoxy compounds having on the average at least two epoxy radicals per molecule, (C) 0.1 to 20 parts by weight of a photoacid generator, and (D) 0.01 to 20 parts by weight of a silane compound of the following general formula (2):

$$(R^{11})_m Si(OR^{12})_{4-m} \qquad (2)$$

wherein $R^{11}$ is a substituted or unsubstituted monovalent hydrocarbon radical of 1 to 9 carbon atoms, $R^{12}$ is an alkyl radical of 1 to 4 carbon atoms, $R^{11}$ and $R^{12}$ may be the same or different, m is an integer of 0 to 2, or a partial hydrolytic condensate thereof.

2. A pattern forming process comprising the steps of:
   (i) applying the photo-curable resin composition of claim 1 to a substrate to form a coating,
   (ii) exposing the coating to light having a wavelength of 150 to 450 nm through a photomask, and
   (iii) developing the exposed coating with a developer.

3. A substrate protecting film obtained by post curing a patterned film of the photo-curable resin composition of claim 1.

4. The substrate-protecting film of claim 3, wherein post-curing is conducting by heating the patterned film in a dryer at 180° C. for one hour.

5. The photo-curable resin composition of claim 1, wherein component (D) is 3 parts by weight of a member selected from the group consisting of
   γ-aminopropyltriethoxysilane arid
   γ-(methacryloxypropyl) trimethoxysilane.

6. A pattern forming process comprising the steps of:
   (i) applying the photo-curable resin composition of claim 1 to a substrate to form a coating,
   (ii) exposing the coating to light having a wavelength of 150 to 450 nm through a photomask, and
   (iii) developing the exposed coating with an isopropyl alcohol developer.

* * * * *